United States Patent
Hu et al.

(10) Patent No.: US 9,099,411 B2
(45) Date of Patent: Aug. 4, 2015

(54) METAL-INDUCED CRYSTALLIZATION OF CONTINUOUS SEMICONDUCTOR THIN FILMS CONTROLLED BY A DIFFUSION BARRIER

(75) Inventors: Shu Hu, Pasadena, CA (US); Paul C. McIntyre, Sunnyvale, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 837 days.

(21) Appl. No.: 13/199,287

(22) Filed: Aug. 24, 2011

(65) Prior Publication Data

US 2013/0048985 A1 Feb. 28, 2013

(51) Int. Cl.
*H01L 21/00* (2006.01)
*H01L 21/324* (2006.01)
*H01L 21/02* (2006.01)

(52) U.S. Cl.
CPC ........ *H01L 21/324* (2013.01); *H01L 21/02532* (2013.01); *H01L 21/02672* (2013.01)

(58) Field of Classification Search
CPC ............ H01L 21/324; H01L 21/02532; H01L 21/02672
USPC ............................................... 257/52, 66, 72
See application file for complete search history.

(56) References Cited

U.S. PATENT DOCUMENTS

| | | | |
|---|---|---|---|
| 6,241,817 B1 | 6/2001 | Jang et al. | |
| 6,277,714 B1 | 8/2001 | Fanash et al. | |
| 6,500,736 B2 | 12/2002 | Kim et al. | |
| 8,536,043 B2 * | 9/2013 | Kim et al. | 438/604 |
| 2010/0184276 A1 | 7/2010 | Maboudian et al. | |
| 2010/0237272 A1 † | 9/2010 | Chaudhari | |
| 2011/0033969 A1 † | 2/2011 | Chaudhari | |

OTHER PUBLICATIONS

Hu et al., "Interface-Controlled Layer Exchange in Metal-Induced Crystallization of Germanium Thin Films", Applied Physics Letters 97, 082104 (published Aug. 24, 2010).*
Chaudhari et al, Heteroepitaxial Silicon Film Growth at 600 C From An Al—Si Eutectic Melt, pp. 5368-5371, Jul. 30, 2010, Thin Solid Films, USA.†

* cited by examiner
† cited by third party

*Primary Examiner* — Laura Menz
(74) *Attorney, Agent, or Firm* — Lumen Patent Firm

(57) ABSTRACT

A device and a method of forming a continuous polycrystalline Ge film having crystalline Ge islands is provided that includes depositing an amorphous Ge (a-Ge) layer on a substrate, oxidizing the top surface of the a-Ge layer to form a $GeO_x$ layer, depositing a seed layer of Al on the $GeO_x$ layer and catalyzing the Al seed layer, where Ge mass transport is generated from the underlying a-Ge layer to the Al seed layer through the $GeO_x$ layer by thermal annealing, where a continuous polycrystalline Ge film having crystalline Ge islands is formed on the Al seed layer.

9 Claims, 6 Drawing Sheets

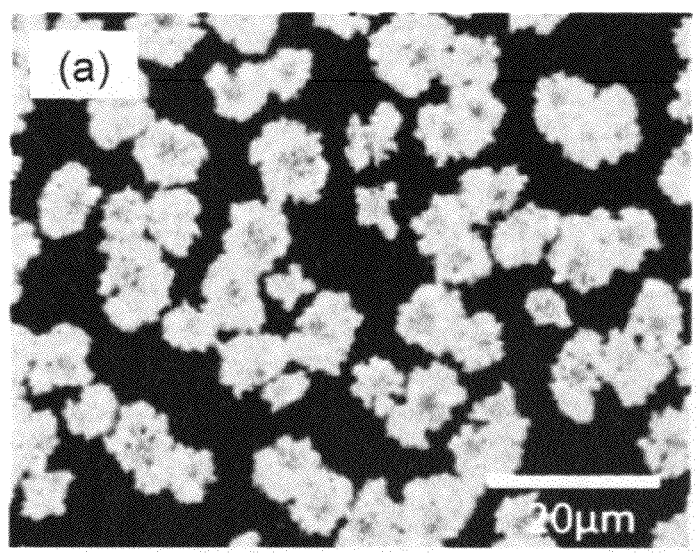
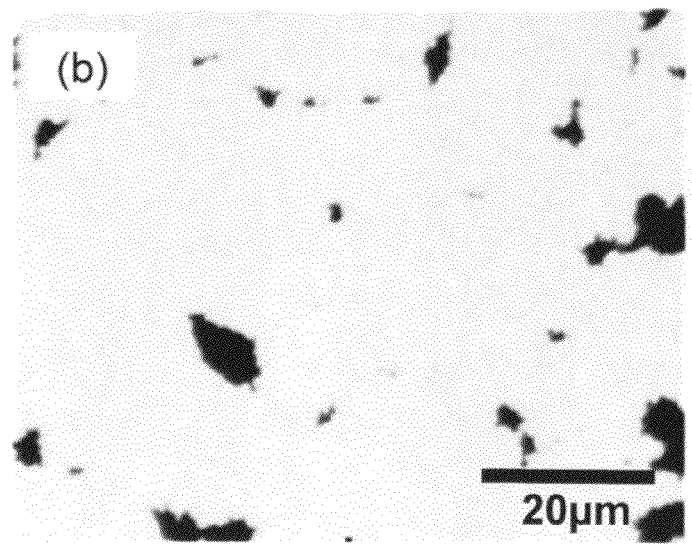
FIG. 1

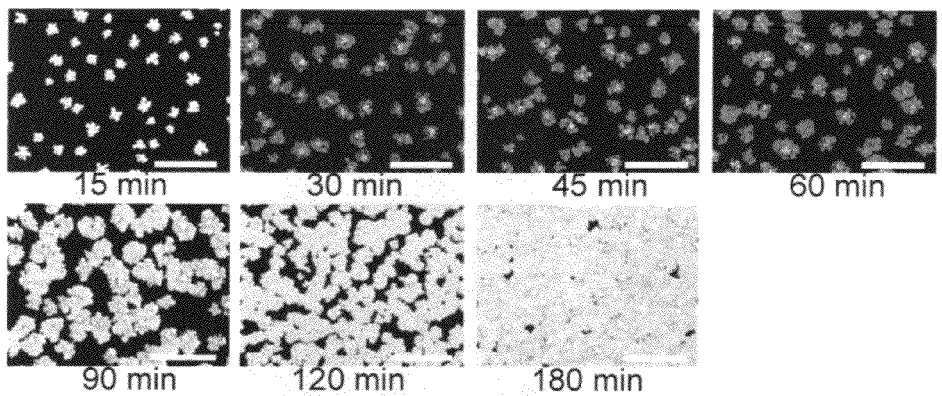
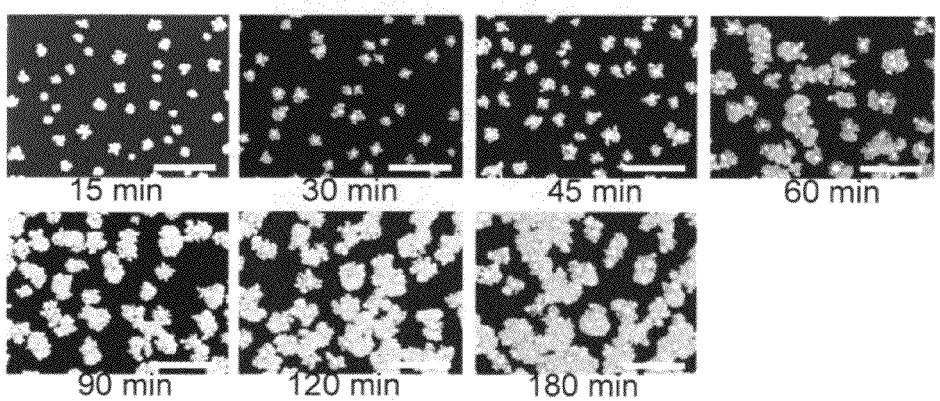
FIG. 2

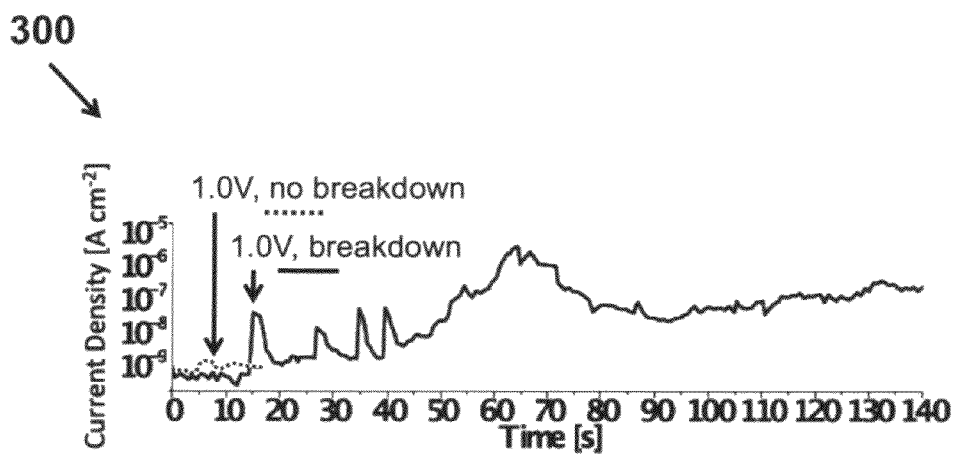

700

METAL-INDUCED CRYSTALLIZATION OF CONTINUOUS SEMICONDUCTOR THIN FILMS CONTROLLED BY A DIFFUSION BARRIER

FIELD OF THE INVENTION

The invention relates to growth of semiconductor thin films. More particularly, the invention relates to deposition of continuous polycrystalline Ge films having crystalline Ge island growth with preferred orientation.

BACKGROUND OF THE INVENTION

Low-temperature synthesis of polycrystalline germanium (poly-Ge) thin films is of great interest in thin-film photovoltaic and electronics applications. Low-temperature synthesis of polycrystalline semiconductor thin films (Si or Ge) on amorphous substrates has important applications in thin-film transistors and solar cells. Recently, (poly-Ge) thin films have been investigated as a low-cost substitute for single crystalline Ge substrates. Ge has good lattice matching with III-V semiconductors, and poly-Ge substrates have been shown to seed epitaxial growth of GaAs or Ge overlayers for polycrystalline single-junction or multijunction solar cell fabrication. Moreover, as-grown poly-Ge films can serve as building blocks for thin-film transistors, a key device in advanced large-area electronics, such as flexible displays.

Metal-induced (e.g., Al, Ni) crystallization (MIC) of amorphous semiconductor films can form polycrystalline films at temperatures much lower than those required in the absence of a metal catalyst. Amorphous Ge (a-Ge) thin films crystallize at 150-250° C. when Ge is in direct contact with Al. This opens up the possibility of crystalline semiconductor deposition on flexible polymeric substrates, whereas a-Ge solid-phase crystallization requires temperatures significantly higher than 300° C. However, a-Ge/Al interfaces exhibit uncontrolled crystallization with growth of randomly oriented Ge nanocrystallites mixed into the Al layer. For many applications, preparation of a polycrystalline semiconductor layer on the surface of a large-area substrate with controlled crystallite size and crystallographic orientation is crucial, and this is difficult to achieve with existing methods.

What is needed is a method of forming oriented crystalline Ge structures on thin films using low-temperature processing for use in thin-film photovoltaics, thin-film transistors and large-area electronics.

SUMMARY OF THE INVENTION

To address the needs in the art, a device and a method of forming a continuous polycrystalline Ge film having crystalline Ge islands is provided that includes depositing an amorphous Ge (a-Ge) layer on a substrate, oxidizing the top surface of the a-Ge layer to form a $GeO_x$ layer, depositing a seed layer of Al on the $GeO_x$ layer and catalyzing the crystallization of Ge using the Al seed layer, such that Ge mass transport occurs from the underlying a-Ge layer to the Al seed layer surface through the $GeO_x$ layer by thermal annealing, where a continuous polycrystalline Ge film having crystalline Ge islands is formed on the Al seed layer.

According to one aspect of the invention, the a-Ge layer has a thickness in a range of 5 nm to 500 nm.

In another aspect of the invention, the $GeO_x$ layer includes $1<x<2$.

In a further aspect of the invention, the $GeO_x$ layer is formed by passing ozone gas or ozone-containing gas mixture over the a-Ge layer, where a thickness of the $GeO_x$ layer is controlled by the oxidation time and the pressure of the ozone.

According to one aspect of the invention, bias-voltage stressing of the $GeO_x$ layer controls the areal density of the crystalline Ge islands. In one aspect, the bias-voltage stressing includes applying an electric field between the Al seed layer and the underlying a-Ge layer, where the electric field has a strength of up to $2 \times 10^7$ V/cm. In another aspect, the bias-voltage stressing includes applying an electric field between the Al seed layer and the underlying a-Ge layer for a duration of up to 1 hour.

According to another aspect of the invention, the thermal annealing includes using a temperature in a range of up to 300° C., and for a duration of up to 6 hrs.

In yet another aspect of the invention, the Al seed layer includes a patterned layer. According to one aspect, the patterned layer includes a pattern of pads that have a cross length in a range of 1 μm to 500 μm.

In a further aspect of the invention, the substrate can include a silicon wafer having a $SiO_2$ layer, glass, flexible anodized Al sheets, or flexible polyethylene terephthalate (PET).

In yet another aspect of the invention, the crystalline Ge islands have a radius up to 150 μm.

According to a further aspect of the invention, the thermal annealing includes annealing in environments that include of vacuum, hydrogen, nitrogen, or argon.

According to one embodiment of the invention a crystalline Ge island nanostructure device is provided that includes an amorphous Ge (a-Ge) layer disposed on a substrate, a $GeO_x$ layer disposed on a top of the amorphous Ge layer, a Al seed layer disposed on the $GeO_x$ layer, and crystalline Ge islands formed on the Al seed layer, where Ge mass transport is generated from the underlying a-Ge layer to the Al seed layer through the $GeO_x$ layer by thermal annealing, where a continuous polycrystalline Ge film having crystalline Ge islands is formed on the Al seed layer.

In one aspect of the current embodiment, the a-Ge layer has a thickness in a range of 5 nm to 500 nm.

In another aspect of the current embodiment, the $GeO_x$ layer includes $1<x<2$.

In a further aspect of the current embodiment, the Al seed layer includes a patterned layer. In another aspect, the patterned layer includes a pattern of pads, where the pads have a cross length in a range of 1 μm to 500 μm.

In yet another aspect of the current embodiment, the substrate can include a silicon wafer having a $SiO_2$ layer, glass, flexible anodized Al sheets, or flexible polyethylene terephthalate (PET).

According to one aspect of the current embodiment, the crystalline Ge islands have a radius up to 150 μm.

In another aspect of the invention, the Al seed layer has a thickness in a range of 2 nm to 400 nm.

According to one aspect of the invention, the seed layer can be Al, Au or Ag.

BRIEF DESCRIPTION OF THE DRAWINGS

FIGS. 1a-1b show SEM micrographs and Ge and Al Auger elemental maps, according to one embodiment of the invention.

FIGS. 2a-2b show Ge surface coverage and the area fraction of Ge on Al, according to one embodiment of the invention.

FIG. 3 shows bias-voltage induced dielectric breakdown of the $GeO_x$ interfacial layers, according to one embodiment of the invention.

FIGS. 4a-4c show SEM micrographs of how the density of nucleated Ge islands varies as a function of the biasing history, according to one embodiment of the invention.

DETAILED DESCRIPTION

Figure 5:
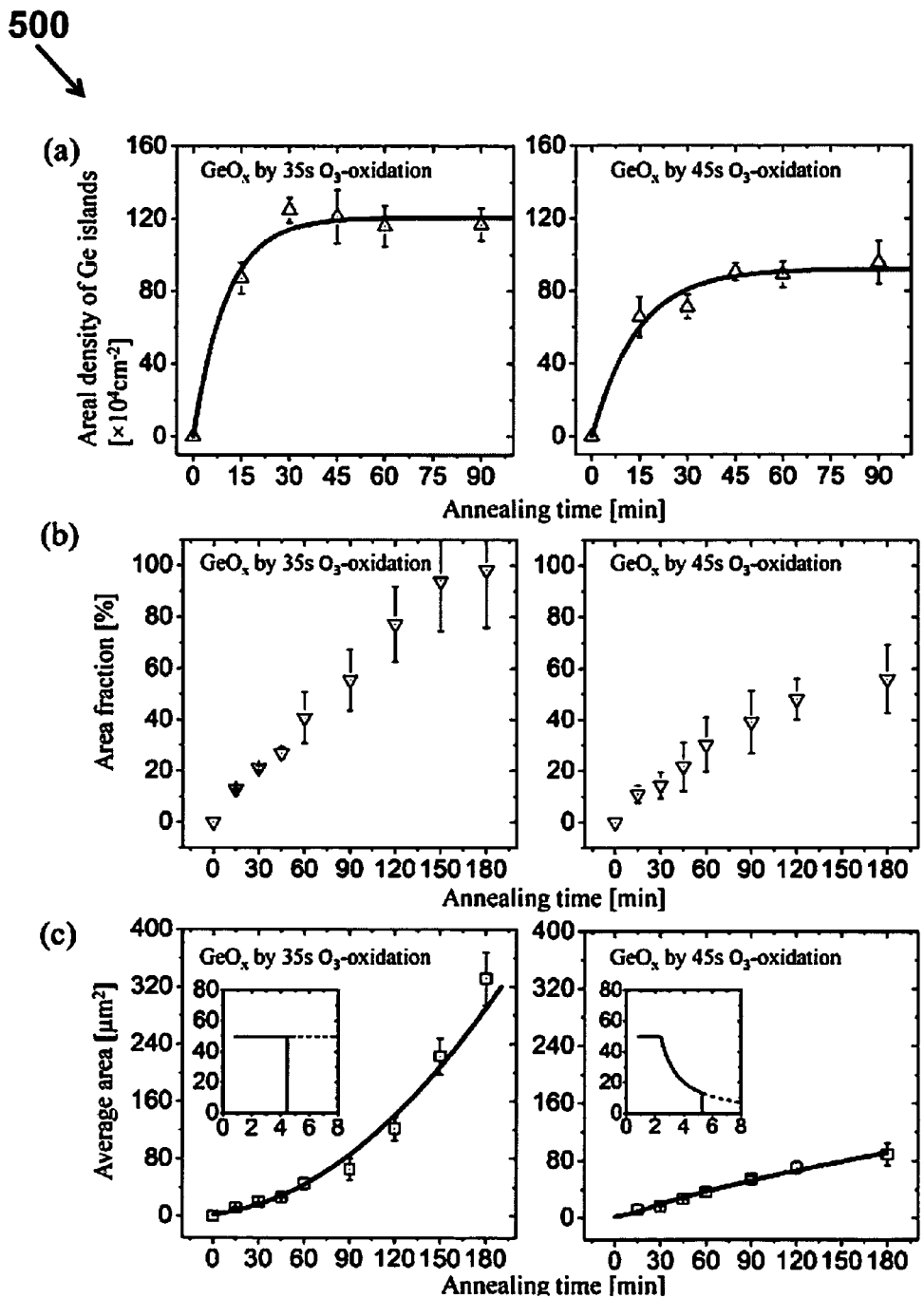
FIGS. 5a-5c show the nucleation behavior for different interfacial layers after layer exchange annealing at 250° C., according to one embodiment of the invention.

The current invention includes Al-seeded layer exchange crystallization to form poly-Ge thin films with micron-sized grains and (111)-preferred orientation at 200° C. A sub-nm $GeO_x$ ($1<x<2$) interfacial layer is intentionally interposed between the upper Al and the underlying a-Ge layer. The Al seed layer can have a thickness in a range of 2 nm to 400 nmm, and the a-Ge layer can have a thickness in a range of 5 nm to 500 nm, where the seed layer can be Al, Au or Ag. The interfacial layer, which can be engineered to provide relatively sparse, nanoscale fast-diffusion paths for Ge transport, controls the nucleation of (111)-oriented Ge crystallites on the Al film surface. During layer exchange crystallization, Ge atoms in the amorphous phase diffuse upwards, and crystalline Ge islands nucleate and grow laterally until completely covering the initially-overlying Al film. In one aspect, the crystalline Ge islands can have a radius up to 150 μm. The driving force is the reduction of free energy during the amorphous Ge to crystalline Ge phase transformation. In one aspect of the invention, the Al layer includes a patterned layer, where the patterned layer includes a pattern of pads that have a cross length in a range of 1 μm to 500 μm. According to different embodiments, the invention can be used with poly-Ge films in thin-film photovoltaics, thin-film transistors, and large-area electronics.

According to one embodiment of the invention, amorphous germanium (a-Ge) and crystalline Al (c-Al) films are deposited in an electron-beam evaporation system with no intentional substrate heating. First, a-Ge thin films (100 nm thick for example) are thermally evaporated on $SiO_2$ substrates. Substrates such as a silicon wafer having a $SiO_2$ layer, glass, flexible anodized Al sheets, or flexible polyethylene terephthalate (PET) can be used. In one example, Si (100) wafers with a thermally oxidized $SiO_2$ film (100 nm thick for example) are used. In one aspect, a series of cleaning procedures are used to remove hydrocarbon and metal contaminants prior to a-Ge film deposition. These can include a sequence of isopropyl alcohol (IPA) rinse for 5 minutes, 4:1 $H_2SO_4$:$H_2O_2$ dip cleaning at room temperature for 10 minutes, 5:1:1 $H_2O$:$H_2O_2$:HCl dip cleaning at room temperature for 10 minutes, followed by drying in $N_2$ atmosphere. The sub-nm $GeO_x$ interfacial layer can be prepared by flowing ozone gas or ozone-containing gas mixture over the as-deposited a-Ge film to oxidize the film surface without substrate heating, where a thickness of the $GeO_x$ layer is controlled by the oxidation time and the pressure of the ozone. In one example, the $GeO_x$ thickness and oxygen stoichiometry x is determined by the oxidation time, using an $O_3$ partial pressure fixed at 0.05 Torr. Oxidized samples are immediately transferred to the electron-beam evaporation system and used as the substrate for Al layer deposition. The thickness of blank Al films (for crystallization kinetics studies) and patterned Al pads (for bias stressing) can be 50 nm.

In another embodiment of the invention, annealing can be carried out at temperatures up to 300° C. in ultra high vacuum, where the annealing time can be a duration of up to 6 hrs, and the annealing environments can include vacuum, hydrogen, nitrogen, or argon.

According to one embodiment, bias-voltage stressing of the $GeO_x$ layer controls the areal density of the crystalline Ge islands. In one aspect, the bias-voltage stressing includes applying an electric field between the Al layer and the a-Ge layer, where the electric field has a strength of up to $2 \times 10^7$ V/cm, and for a duration of up to 1 hour. In one example, a Ti layer and a 25 nm Pt layer are deposited sequentially as the back electrode prior to 100 nm a-Ge deposition, and Al films were patterned into 200 μm diameter circular pads. A computer-programmed voltage source (Keithley 230) can be applied a constant bias between the Al pad and the underlying Pt/Ti metal layers. The voltage drop across the $GeO_x$ layer is defined by the applied bias.

Layer exchange crystallization of a-Ge seeded by Al was directly observed by imaging Ge islands on the Al film surface with elemental contrast after annealing. During thermal annealing, Ge atoms diffuse upwards through the $GeO_x$ interfacial layer to the Al surface, nucleate polycrystalline Ge islands on the Al surface and these overgrow laterally until impinging with one another, resulting in a distribution of Al and Ge elements on the sample surface prior to completion of a-Ge crystallization. FIGS. 1a-1b show plan-view scanning electron microscopy (SEM) micrographs 100 for the samples annealed for 90 min and 3 h, respectively. The bright contrast regions in FIG. 1a are Ge-rich, and the dark contrast regions in FIG. 1a are Al-rich. FIG. 1b shows near-complete Ge surface coverage after annealing for 3 h at 250° C. Given sufficiently long annealing time, crystalline Ge can substantially cover the original Al surface.

SEM was used to characterize Ge surface coverage on the Al layer for all the annealed samples in the following example. Imaging the Ge surface distribution at various stages of crystallization allows one to independently measure the areal density and average area of Ge crystal islands as a function of annealing time. The size of Ge islands is correlated with the size of Ge grains within them. The islands are composed of multiple grains. The thickness of the Ge islands remains approximately constant as they grow laterally, which is indicated by the uniform thickness of as-crystallized Ge layers observed in cross-section TEM characterization. FIGS. 2a-2b show Ge surface coverage SEM images 200, where the GE surface coverage, or the area fraction of Ge on Al, increases after annealing at 250° C. for 15, 30, 45, 60, 90, 120, and 180 minutes. The SEM images, one displayed per sample, were from two sample batches: one batch with a thin $GeO_x$ interfacial layer prepared by 35 s $O_3$-oxidation, as shown in FIG. 2a; and the other with a $GeO_x$ layer prepared by 45 s $O_3$-oxidation, as shown in FIG. 2b. The scale bar for all the SEM images 200 is 20 μm. Detailed analysis of the SEM images 200 indicates how Ge island nucleation and growth behave as a function of $GeO_x$ layer characteristics and annealing temperatures at various stages of crystallization.

Figure 6:
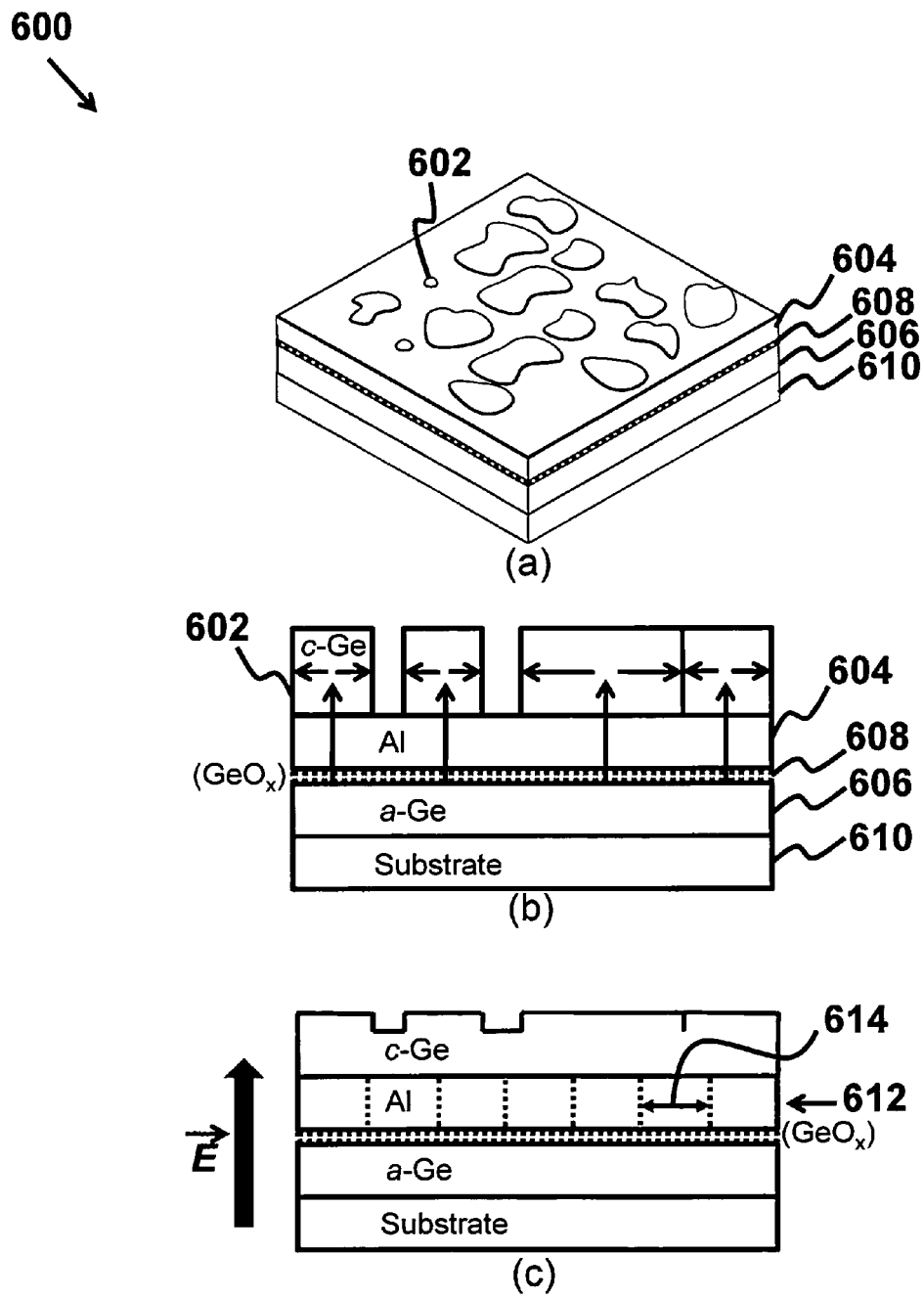
FIGS. 6a-6c show schematic drawings of the crystalline Ge island nucleation, according to one embodiment of the invention.

The effects of local bias-voltage induced dielectric breakdown of the $GeO_x$ layers are discussed, where local bias-voltage induced dielectric breakdown of the $GeO_x$ layers provides a way to tune the density of nucleated Ge islands with an applied electrical field (see FIG. 6c). As an example, Al pads (200 μm in diameter) were patterned on the a-Ge film with an O₃-grown GeOₓ layer. Then, 1.0V DC bias was applied to individual Al pads for different durations, e.g. 16 s and 140 s, with the sample annealed immediately thereafter at 200° C. for 20 minutes in vacuum to induce island nucleation. Statistically, there are two types of biasing history 300, as shown in FIG. 3. Here, the solid-line curve represents one type of biasing history in which current spikes occur periodically (e.g. at times <140 s) and the leakage current density gradually increases, an indication of accumulated damage in the GeOₓ layer akin to soft dielectric breakdown. The dashed-line curve represents the other type of biasing history, where the current density remains low before the occurrence of any significant change in the current density, and then the bias is removed. The cumulative charge per area that flows across the GeOₓ layers for both types of biasing experiments is on the order of $10^{-2}$ C cm$^{-2}$ and $10^{-7}$ C cm$^{-2}$, respectively. The density of nucleated Ge islands varies significantly as a function of the biasing history, as indicated by the series of SEM micrographs 400 in FIGS. 4a-4c. DC bias stressing increases the density of defective sites in the GeOₓ layer, and thus controls the areal density of Ge islands nucleated on the Al film surface.

At various stages of crystallization, the areal density and average area of Ge crystal islands on the Al layer was measured and the results were compared to a proposed kinetic model for layer exchange crystallization. The images, which were collected from random locations on each sample, were analyzed with the software package Image. The bright contrast regions were marked and counted as crystallized Ge islands, in keeping with the contrast differences observed in FIGS. 1a-1b. Each data point is obtained by statistical analysis of the images collected from each sample. FIG. 5a shows the nucleation behavior 500 for different interfacial layers (GeOₓ grown by room temperature O₃-oxidation for 35 s vs. 45 s) after layer exchange annealing at 250° C. There is an upper limit for the density of Ge islands, which saturates at $1.206 \times 10^6$ cm$^{-2}$ for the GeOₓ layer prepared by 35 s oxidation and $9.21 \times 10^5$ cm$^{-2}$ for the layer prepared by 45 s oxidation after ~30 min and ~60 min anneals, respectively. It is assumed there is an existence of a fixed number of randomly distributed sites where Ge islands could possibly nucleate (the areal density of fast-diffusion paths through the GeOₓ layer), characteristic of the a-Ge oxidation time. Maximum nucleus density was achieved prior to coalescence of most of the Ge islands and within 10's of minutes of annealing, which suggests a decaying nucleation rate with time. Ge island growth for the 35 s and 45 s samples with different maximum nucleus densities was also measured, as shown in FIG. 5b and FIG. 5c. Below, a model for island nucleation, growth and coalescence is described, which will guide the subsequent analysis.

For growth of individual Ge islands, two limiting cases are considered: 1) linear radial growth, characterized by transformation of Ge atoms in the amorphous phase to the crystalline phase at the island growth front and 2) Ge surface diffusion-limited growth, characterized by Ge surface atomic fluence that decreases with the island radius and the annealing time. FIGS. 6a-6c schematically illustrate the nucleation 600, where FIG. 6a shows lateral growth and coalescence of disk-shaped crystalline Ge islands 602 on the surface of the Al layer 604 during annealing. As shown in FIG. 6b, microscopically, Ge atoms diffuse from the a-Ge layer 606, shown disposed on a substrate 610 through the GeOₓ layer 608 via a low areal density of fast-diffusion paths, become surface adsorbed adatoms along Al/Ge interface or on the Al surface, and contribute to the lateral growth of crystalline Ge islands. Upward diffusion of Ge atoms to Al film surface is likely through grain boundaries in the Al film. FIG. 6c shows a patterned Al layer 612, where the patterned layer includes a pattern of pads 614 that have a cross length in a range of 1 μm to 500 μm.

When there is a transition between the two growth regimes, one expects a Ge island of radius $r_I$ to initially grow radially at a constant rate $v_G$ up to a threshold radius $r_T$, with further growth being diffusion-limited. The subject model assumes that Ge islands nucleate with a cylindrical shape 602 (see FIG. 6a) at a critical radius $r_e$ and that the initial growth rate $v_G$ is temperature dependent with an activation energy of $Q_G$, which is related to the energy barrier for Ge atoms to migrate across the growth front. The diffusion-limited growth velocity is:

$$v = \frac{dr_I}{dt} = \frac{D^*}{r_I \ln(r_I/r_e)}, \quad (1)$$

where $r_I$ is the radius of island growth front, and $r_e$ is the critical radius at which the Ge island nucleates initially. $D^*$ is defined as the effective diffusion coefficient, which is a measure of the surface or interface chemical diffusivity for Ge atoms diffusion on the Al film surface or along the Al/Ge interface. The growth of individual Ge islands can be described in the following compact form. Continuity of island growth velocity at $r_I = r_T$ is imposed to combine the two growth mechanisms, resulting in:

$$v = \frac{dr_I}{dt} = \begin{cases} v_0 \exp(-Q_G/kT), & r_I \leq r_T \\ \dfrac{D^*}{r_I \ln(r_I/r_e)}, & r_I > r_T, \end{cases} \quad (2)$$

with the threshold radius $r_T$ satisfying, $$\frac{D^*}{r_T \ln(r_T/r_e)} = v_G. \quad (3)$$

In the linear growth regime, $v_0$ is a temperature-independent pre-factor and $Q_G$ is the activation energy for the temperature-dependent growth rate $v_G$. At temperature T, the transition point to diffusion-limited growth will depend on the relative values of the constant growth rate $v_G$ and the effective surface diffusion coefficient $D^*$. The area fraction of Ge on Al, which is the degree of layer exchange crystallization f(t), is written as:

$$f(t) = 1 - \exp(-A^e/A) = 1 - \exp(-\int_0^t \dot{N}_N(\tau) Y(\tau, t) d\tau), \quad (4)$$

where A is the sample surface area, $A^e$ is the extended area, $\dot{N}_N(\tau)$ is the nucleation rate at time $\tau$, and $Y(\tau,t)$ is the area of a Ge island that nucleates at time τ and grows until time t. Here, it is assumed that growth rates of individual Ge islands involve the supply of Ge atoms from underneath the central region of nucleated Ge islands.

Two methods were used to track the time dependence of the average area of the Ge islands, as a proxy measure of Ge island growth: (1) directly counting islands when there is no impingement, and (2) indirectly calculating the average area from the measured surface area fraction and the areal density of Ge islands nucleated on the film surface using Eq. (4) after coalescence of Ge islands begins. The integration in the exponential term of Eq. (4) is approximately equal to the product of the nucleation density and the average area of the Ge islands overgrowing the Al film. The second method is a good estimate because the nucleus density quickly saturates prior to coalescence of most Ge islands during annealing. The values from the direct measurements and the indirect calculations are identical when there is no coalescence. Furthermore, the second method considers the contribution of Ge island growth to an increase in the extended area that is calculated from Ge surface coverage in FIG. 5b, an important intermediate step for the growth kinetics analysis. Although the apparently fractal growth in FIGS. 2a-2b and in reported Au/Ge crystallization indicates local anisotropy of the growth velocity, the assumption of isotropic radial growth of Ge islands is in reasonably good agreement with the measured data. As shown in FIG. 5c, the data points for the 35 s $GeO_x$ layer exhibit a parabolic increase of average island area with time, indicating linear growth with a constant radial growth velocity. Data for the 45 s $GeO_x$ layer exhibit a non-linear increase of the island area with time at later stages of annealing, indicating diffusion-limited growth.

Interestingly, one of the two distinctive growth mechanisms appears to dominate after ~60 min annealing, depending on the areal density of nucleated Ge islands as a result of using different interfacial layers. As the island density decreases, the average distance between neighboring Ge islands increases. Without coalescence considered, a Ge island should follow a transition from linear radial growth (e.g. atomic-transformation-limited) to surface diffusion-limited growth, consistent with the results shown in FIG. 5c for the $GeO_x$ layer prepared by 45 s $O_3$-oxidation. However, if the poly-Ge islands begin to impinge on one-another, neighboring Ge islands impose geometric constraints on each island's lateral growth. If the average island separation is small enough, e.g. for the 35 s $GeO_x$ samples, a substantial number of Ge islands coalesce prior to the transition to the diffusion-limited growth regime. The Ge surface area fraction on the Al layer continues to increase as displayed in FIG. 5b, while the extended area fraction increases in a parabolic fashion with time. The FIG. 5c insets show the calculated growth velocities as a function of the Ge island radius based on the measured average area. When the sum of the radii of two neighboring Ge islands exceeds the average island separation, substantial island coalescence occurs and lateral growth is no longer the case for the majority of Ge islands, as indicated by the dashed line in the FIG. 5c insets. The threshold radius (~3 μm) extracted from the calculated growth velocities is comparable to the average distance between neighboring Ge islands for the 45 s $GeO_x$ samples. This may explain why a small decrease in this average distance inhibits the transition to the diffusion-limited growth regime, when switching from the 45 s $GeO_x$ samples to the 35 s $GeO_x$ samples.

In addition, the temperature dependence of Ge island nucleation and growth is discussed. The samples prepared by 35 s $O_3$-oxidation are emphasized here, and the previous analysis is repeated for both 200° C. and 300° C. annealing. The measured data points are interpreted using the aforementioned model, with fitted parameters listed in Table 1.

TABLE 1

List of fitted parameters for the kinetics model of nanoscale nucleation and lateral growth of Ge islands in two dimensions.

| Sample and annealing condition | Maximum nucleus density, $N_0$ [$10^4$ cm$^{-2}$] | Nucleation saturation time, $\tau_N$ [min] | Growth Mechanism | Linear growth velocity, $v_0$ [nm min$^{-1}$] | Diffusion-limited growth Effective diffusion coefficient, $D^*$ [cm$^2$ s$^{-1}$] | Size of critical nuclei, $r_e$ [μm] |
|---|---|---|---|---|---|---|
| $GeO_x$ by 35 s $O_3$-oxidation/250° C. | 117.7 ± 4.5 | 11.5 | Linear growth | 51 ± 1 | Not applicable | |
| $GeO_x$ by 45 s $O_3$-oxidation/250° C. | 92.1 ± 4.2 | 14.3 | Linear growth/ diffusion-limited | 51 ± 1 | (2.13 ± 0.25) × 10$^{-11}$ [a] | 0.83 ± 0.01 |
| $GeO_x$ by 35 s $O_3$-oxidation/200° C. | 79.1 ± 3.5 | τ→0 | Mostly diffusion-limited | 7.9 ± 0.8 | (4.28 ± 0.17) × 10$^{-13}$ [a] | 2.0 ± 0.1 |
| $GeO_x$ by 35 s $O_3$-oxidation/300° C. | >150 | Not applicable | Linear growth | 400 ± 20 | Not applicable | |

Figure 7:
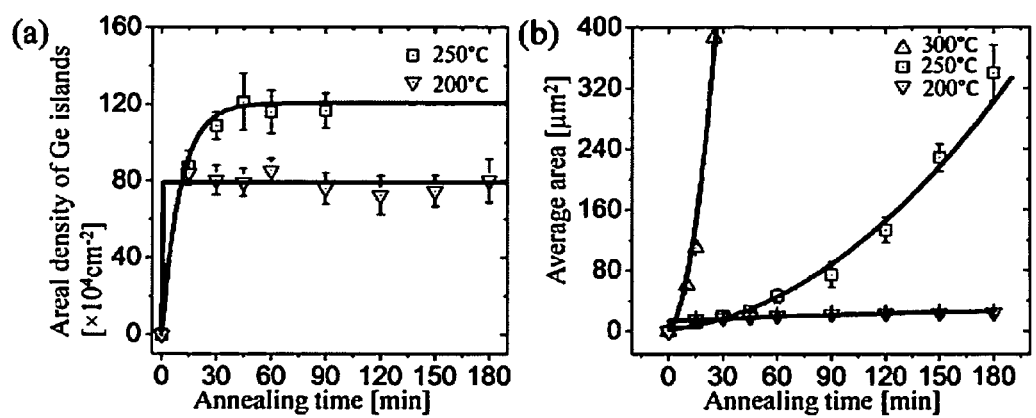
FIGS. 7a-7b show graphs of the areal density of nucleated Ge islands vs. annealing time and Ge island growth after 200° C., 250° C. and 300° C. annealing, respectively, according to one embodiment of the invention.

First, the maximum nucleus density $N_0$ and the nucleation saturation time $\tau_N$ are fitted from the measured nucleation kinetics for the various $GeO_x$ interfacial layers and annealing conditions investigated. The linear growth velocity $v_0$ is estimated from the growth kinetics in the linear regime only. The effective diffusion coefficient $D^*$ and average size of island critical nuclei $r_e$ are fitted to Eq. (2) from the growth kinetics data in the diffusion-limited regime. Finally, the threshold radius $r_T$ is calculated from $v_0$, $D^*$ and $r_e$ using Eq. (3). The calculated curves for the density and average area of the Ge islands are least-squares fits to the model and are also plotted in FIG. 5a and FIGS. 7a-7b (700). FIG. 7a shows the areal density of nucleated Ge islands vs. annealing time, with the maximum nucleus density equal to 7.91×10$^5$ cm$^{-2}$ for 200° C. annealing and with the Avrami time constant $\tau_N$ close to zero. Lower annealing temperature reduces the probability of a certain nucleation site being active, decreasing the maximum nucleus density. FIG. 7b shows Ge island growth after 200° C., 250° C. and 300° C. annealing. The growth at 300° C. exhibited linear growth kinetics at a constant radial island growth rate of 400±20 nm min$^{-1}$. The activation energy for the growth velocities is estimated to be 0.90±0.11 eV. On the other hand, the growth at 200° C. exhibited a strongly diffusion-limited mechanism, with the transition to surface diffusion-limited growth occurring at an early stage of annealing.

Such a disparity in the growth mechanisms for 250° C. and 300° C. vs. 200° C. annealing indicates the temperature dependence of the threshold radius, characteristic of the transition. Both linear growth (e.g. Ge atom attachment to the island growth front) and Ge surface diffusion on the Al layer are thermally activated processes. Analysis of the data in FIGS. 7a-7b indicates that when the annealing temperature decreases from 250° C. to 200° C., the constant growth rate, $v_G$, reduces by a factor of ~⅙, while the effective surface diffusion coefficient, $D^*$, decreases by ~2 orders of magnitude. The diffusion-limited growth velocity decreases much more strongly with temperature reduction, so that the threshold radius shifts to a smaller value for lower annealing temperatures. While the maximum nucleus density is also reduced at 200° C., the growth of Ge islands is strongly diffusion-limited. Such insights are critical in optimizing annealing temperatures and time to produce an efficient process of minimal thermal budget for device fabrication. Modeling Ge layer exchange crystallization as a simple one-step kinetic process, the natural assumption in the absence of the thorough mechanistic description provided in this work is inadequate to predict rates and design the metal-induced crystallization process.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. All such variations are considered to be within the scope and spirit of the present invention as defined by the following claims and their legal equivalents.

What is claimed:

1. A crystalline Ge islands nanostructure device, comprising:
   a. an amorphous Ge (a-Ge) layer disposed on a substrate;
   b. a $GeO_x$ layer disposed on a top of said amorphous Ge layer;
   c. a catalyzed Al seed layer disposed on said $GeO_x$ layer;
   d. crystalline Ge islands disposed on said Al seed layer, and
   e. an annealed continuous polycrystalline Ge film having crystalline Ge islands on said Al seed layer, wherein Ge mass transport is generated from said underlying a-Ge layer to said Al seed layer through said $GeO_x$ layer by thermal annealing in a vacuum.

2. The device of claim 1, wherein said a-Ge layer has a thickness in a range of 5 nm to 500 nm.

3. The device of claim 1, wherein said $GeO_x$ layer comprises $1<x<2$.

4. The device of claim 1, wherein said Al seed layer comprises a patterned layer.

5. The device of claim 4, wherein said patterned layer comprises a pattern of pads, wherein said pads have a cross length in a range of $\mu m$ to 500 $\mu m$.

6. The device of claim 1, wherein said substrate is selected from the group consisting of a silicon wafer having a $SiO_2$ layer, glass, flexible anodized Al sheets, and flexible polyethylene terephthalate (PET).

7. The device of claim 1, wherein said crystalline Ge islands have a radius up to 150 $\mu m$.

8. The device of claim 1, wherein said Al seed layer has a thicknesses in a range of 2 nm to 400 nm.

9. The device of claim 1, wherein said seed layer is selected from the group consisting of Al, Au and Ag.

* * * * *